(12) United States Patent
Kim

(10) Patent No.: US 11,151,351 B2
(45) Date of Patent: Oct. 19, 2021

(54) THREE-DIMENSIONAL FINGERPRINT SENSING DEVICE, METHOD OF SENSING FINGERPRINT BY USING THE SAME, AND ELECTRONIC APPARATUS INCLUDING THE SAME

(71) Applicant: SAMSUNG ELECTRONICS CO., LTD., Suwon-si (KR)

(72) Inventor: Hyunjoon Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 105 days.

(21) Appl. No.: 16/122,293

(22) Filed: Sep. 5, 2018

(65) Prior Publication Data
US 2019/0180071 A1    Jun. 13, 2019

(30) Foreign Application Priority Data
Dec. 11, 2017    (KR) .......................... 10-2017-0169531

(51) Int. Cl.
*G06K 9/00* (2006.01)
*H01L 27/32* (2006.01)
*G02B 3/00* (2006.01)
*H01L 51/52* (2006.01)

(52) U.S. Cl.
CPC .......... *G06K 9/0004* (2013.01); *G02B 3/005* (2013.01); *G06K 9/0008* (2013.01); *H01L 27/3227* (2013.01); *H01L 27/323* (2013.01); *H01L 51/5284* (2013.01)

(58) Field of Classification Search
CPC .... G06K 9/0004; G06K 9/00013; G06K 7/14; G06K 9/0008; G06F 2203/0338
See application file for complete search history.

(56) References Cited

U.S. PATENT DOCUMENTS

| 4,322,163 | A | * | 3/1982 | Schiller | ............... | A61B 5/1172 |
| | | | | | | 356/71 |
| 7,366,331 | B2 | | 4/2008 | Higuchi | | |
| 2008/0074401 | A1 | * | 3/2008 | Chung | ................. | G06F 3/0421 |
| | | | | | | 345/175 |
| 2008/0101664 | A1 | | 5/2008 | Perez | | |

(Continued)

FOREIGN PATENT DOCUMENTS

| KR | 10-2017-0087358 A | 7/2017 |
| KR | 10-2019-0004678 A | 1/2019 |
| WO | 2017/058473 A1 | 4/2017 |

*Primary Examiner* — Yuzhen Shen
(74) *Attorney, Agent, or Firm* — Sughrue Mion, PLLC

(57) ABSTRACT

Provided are a three-dimensional (3D) fingerprint sensing device capable of performing 3D fingerprint recognition for enhanced security, a method of sensing a fingerprint by using the same, and an electronic apparatus including the same. The 3D fingerprint sensing device includes: a light-emitter including organic light-emitting diode (OLED) pixels configured to emit visible light; a 3D fingerprint sensing unit including a light source configured to emit invisible light, a first optical sensor configured to receive first light incident in a first direction, and a second optical sensor configured to receive second light incident in a second direction, where the second direction is different from the first direction; and a light-mixing blocker configured to prevent a mixing of light.

20 Claims, 14 Drawing Sheets

(56) References Cited

U.S. PATENT DOCUMENTS

| | | | |
|---|---|---|---|
| 2012/0026093 A1* | 2/2012 | Duparre | G06F 3/0425 |
| | | | 345/166 |
| 2012/0146953 A1* | 6/2012 | Yi | G06F 3/0412 |
| | | | 345/175 |
| 2013/0129163 A1* | 5/2013 | Chung, II | G06K 9/0004 |
| | | | 382/124 |
| 2015/0187980 A1* | 7/2015 | Yamamoto | G06F 1/00 |
| | | | 250/552 |
| 2015/0331508 A1 | 11/2015 | Nho et al. | |
| 2016/0132712 A1 | 5/2016 | Yang et al. | |
| 2016/0266695 A1* | 9/2016 | Bae | G06F 1/1643 |
| 2017/0123542 A1* | 5/2017 | Xie | H01L 27/3227 |
| 2017/0220839 A1 | 8/2017 | Yang et al. | |
| 2017/0255810 A1* | 9/2017 | Liu | H01L 29/78633 |
| 2017/0270342 A1* | 9/2017 | He | G06F 21/32 |
| 2017/0337413 A1* | 11/2017 | Bhat | G06K 9/0002 |
| 2018/0005005 A1* | 1/2018 | He | G06K 9/0004 |
| 2018/0225498 A1 | 8/2018 | Setlak | |
| 2019/0013368 A1 | 1/2019 | Chung et al. | |
| 2019/0279566 A1* | 9/2019 | Wang | G09G 3/3241 |
| 2020/0334436 A1* | 10/2020 | Xu | G09F 9/33 |

* cited by examiner

THREE-DIMENSIONAL FINGERPRINT SENSING DEVICE, METHOD OF SENSING FINGERPRINT BY USING THE SAME, AND ELECTRONIC APPARATUS INCLUDING THE SAME

CROSS-REFERENCE TO RELATED APPLICATION

This application claims priority from Korean Patent Application No. 10-2017-0169531, filed on Dec. 11, 2017, in the Korean Intellectual Property Office, the disclosure of which is incorporated herein in its entirety by reference.

BACKGROUND

1. Field

Apparatuses and methods consistent with exemplary embodiments relate to a three-dimensional (3D) fingerprint sensing device, a method of sensing a fingerprint by using the 3D fingerprint sensing device, and an electronic apparatus including the 3D fingerprint sensing device, and more particularly, to a 3D fingerprint sensing device including a 3D fingerprint sensing unit configured to obtain a 3D fingerprint image, a method of sensing a fingerprint by using the 3D fingerprint sensing device, and an electronic apparatus including the 3D fingerprint sensing device.

2. Description of the Related Art

Organic light-emitting diodes (OLEDs) have excellent characteristics with respect to brightness, driving voltages, and response rates, and are capable of realizing color images. Thus, OLEDs are implemented in various display apparatuses.

Meanwhile, recently, in the industries of finance, health care, mobile technology, etc., demand has also increased for display apparatuses that implement biometrics technology that is configured to extract specific biometrics information or behavioral characteristic information of a human by using an automated device for user authentication. In particular, fingerprint recognition technology and iris recognition technology, applied by leading companies of the smartphone industry, have drawn attention toward biometrics technology.

There have been continuous attempts to mount an optical fingerprint sensor, for fingerprint recognition, in electronic apparatuses such as smartphones, etc. However, in the case of conventional optical fingerprint sensors and electronic apparatuses in which such conventional optical fingerprint sensors are mounted, a picture of a fingerprint is not distinguishable from a real fingerprint, and thus, security issues may arise. Also, in the case of a conventional optical fingerprint sensor and an electronic apparatus in which a conventional optical fingerprint sensor is mounted, due to noise caused by a distance between the fingerprint sensor and the fingerprint, the fingerprint recognition rate may be decreased.

SUMMARY

One or more exemplary embodiments may provide a three-dimensional (3D) fingerprint sensing device configured to recognize three-dimensional curves of a fingerprint and not to negatively affect an aperture ratio of a light-emitter, and an electronic apparatus including the 3D fingerprint sensing device.

One or more exemplary embodiments may provide a 3D fingerprint sensing device configured to recognize three-dimensional curves of a fingerprint, to reduce the effect of a light-emitter on an aperture ratio, and to have a reduced thickness, and an electronic apparatus including the 3D fingerprint sensing device.

Additional exemplary aspects and advantages will be set forth in part in the description which follows and, in part, will be apparent from the description, or may be learned by practice of the presented exemplary embodiments.

According to an aspect of an exemplary embodiment, a three-dimensional (3D) fingerprint sensing device includes: a light-emitter including organic light-emitting diode (OLED) pixels configured to emit visible light; a 3D fingerprint sensing unit including a light source configured to emit invisible light toward an object, a first optical sensor configured to receive first light reflected from the object in a first direction, and a second optical sensor configured to receive second light reflected from the object in a second direction, wherein the second direction is different from the first direction; and a light-mixing blocker arranged above or below the light-emitter and configured to prevent the first light from being incident on the second optical sensor and to prevent the second light from being incident on the first optical sensor.

The 3D fingerprint sensing unit may be arranged below the light-emitter.

The light source, the first optical sensor, and the second optical sensor may be arranged below the OLED pixels, thereby overlapping with the OLED.

The light source may be arranged below an OLED pixel configured to display a first color, the first optical sensor may be arranged below an OLED pixel configured to display a second color, and the second optical sensor may be arranged below an OLED pixel configured to display a third color.

All of the light source, the first optical sensor, and the second optical sensor may be arranged below one single OLED pixel.

The 3D fingerprint sensing unit and the light-emitter may be arranged in a same layer.

The light source, the first optical sensor, and the second optical sensor may be arranged between adjacent ones of the OLED pixels.

The first optical sensor and the second optical sensor may be spaced apart from each other with the light source therebetween.

The light-mixing blocker may include a lenticular lens array arranged between the light-emitter and the 3D fingerprint sensing unit.

The light source may include a light source configured to irradiate light of at least one of a near-infrared (NIR) wavelength range and an infrared (IR) wavelength range.

The light-mixing blocker may be arranged on the light-emitter and may include a parallax barrier configured to block the invisible light irradiated by the light source and to allow the visible light irradiated by the OLED pixels to penetrate therethrough.

The 3D fingerprint sensing device may further include a passivation layer arranged on the light-mixing blocker.

According to an aspect of another exemplary embodiment, an electronic apparatus includes the 3D fingerprint sensing device.

According to an aspect of another exemplary embodiment, a method of sensing a fingerprint by using the 3D fingerprint sensing device includes: sensing a ridge and a valley of the fingerprint by receiving light reflected from an object, via the first optical sensor and the second optical sensor; and determining whether the fingerprint is real or fake based on information of directions of incidence of the light sensed via the first optical sensor and the second optical sensor, respectively.

The determining of whether the fingerprint is real or fake may include determining that the fingerprint is real when the light reflected from the valley diverges or when the light reflected from the ridge converges.

The method may further include removing a noise signal based on the information of the direction of incidence of the light sensed via the first optical sensor and the second optical sensor, respectively.

The removing of the noise signal may include, when non-directional light is sensed via the first optical sensor and the second optical sensor, removing the signal corresponding to the non-directional light as the noise signal.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
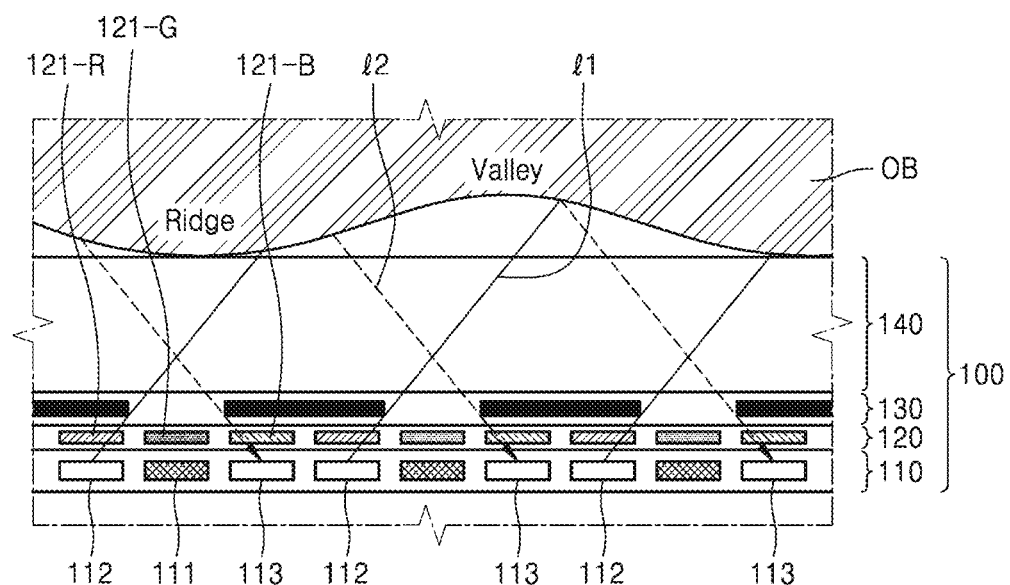
FIG. 1 is a cross-sectional view schematically showing a structure of a three-dimensional (3D) fingerprint sensing device according to an exemplary embodiment.

Hereinafter, the present disclosure will be described in detail with reference to the accompanying drawings.

In the drawings, like reference numerals refer to like elements throughout, and sizes of components may be exaggerated for convenience of explanation. It should be understood that, although the terms first, second, etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise. It should be further understood that when a part "includes" or "comprises" an element, unless otherwise defined, the part may further include other elements, not excluding the other elements.

Expressions such as "at least one of," when preceding a list of elements, modify the entire list of elements and do not modify the individual elements of the list.

FIG. 1 is a cross-sectional view schematically showing a structure of a three-dimensional (3D) fingerprint sensing device 100 according to an exemplary embodiment. Referring to FIG. 1, the 3D fingerprint sensing device 100 may include a 3D fingerprint sensing unit 110, a light-emitter 120, a light-mixing blocker 130, and a passivation layer 140.

The 3D fingerprint sensing unit 110 may include a light source 111, a first optical sensor 112, and a second optical sensor 113.

The light source 111 may irradiate invisible light toward an object OB. Here, the object OB may correspond to, for example, a human fingerprint. The light source 111 may include a light-emitting diode (LED) configured to irradiate invisible light, an organic LED (OLED), etc., but is not limited thereto. When the light source 111 is an OLED, the light source 111 may be elastic and flexible, and thus, may form a part of a flexible electronic apparatus. The light source 111 may irradiate light in an IR wavelength range or a NIR wavelength range. An NIR wavelength range may be between about 800 nm to about 1500 nm. An IR wavelength range may be between about 1500 nm to about 8000 nm.

The first optical sensor 112 may be a light-receiving device configured to receive first light l1 reflected from the object OB in a first direction. The second optical sensor 113 may be a light-receiving device configured to receive second light l2 reflected from the object OB in a second direction. The first light l1 and the second light l2 may be irradiated by the light source 111 and reflected from the object OB in different directions based on a shape of a surface of the object OB. The first optical sensor 112 and the second optical sensor 113 may receive light reflected in different directions, thereby enabling the construction of a 3D image based on the shape of the surface of the object OB.

The first optical sensor 112 and the second optical sensor 113 may include light-receiving devices suitable for receiving the invisible light irradiated by the light source 111. For example, the first optical sensor 112 and the second optical sensor 113 may include light-receiving devices suitable for receiving light in an NIR wavelength range or an IR wavelength range. For example, the first optical sensor 112 and the second optical sensor 113 may include light-receiving devices including an organic light-absorption layer suitable for absorption of the light in the NIR wavelength range. For example, the first optical sensor 112 and the second optical sensor 113 may include light-receiving devices including an organic light-absorption layer including at least one of naphthalocyanine, bisdithiolene, and squaranine. When the first optical sensor 112 and the second optical sensor 113 include such an organic light-absorption layer, the first optical sensor 112 and the second optical sensor 113 may be elastic and flexible, and thus, may form a part of a flexible electronic apparatus.

The first optical sensor 112 and the second optical sensor 113 may be regarded, together, as a single light-receiving pixel. For example, the first optical sensor 112 and the second optical sensor 113 may be connected to an external controller (not shown) and may transmit, to the external controller, information of intensities of light received by the first optical sensor 112 and the second optical sensor 113. The external controller may derive information of optical orientation based on a difference between the intensities of the light received by the first optical sensor 112 and the second optical sensor 113. For example, when the intensity of the light received by the first optical sensor 112 is greater than the intensity of the light received by the second optical sensor 113, the controller may determine that the path of light in the first direction is closed to a surface of the object OB than the path of light in the second direction. For example, when the intensity of the light received by the first optical sensor 112 and the intensity of the light received by the second optical sensor 113 are equal, it may indicate that the surface of the object OB is flat or substantially flat.

The first optical sensor 112 and the second optical sensor 113 may be spaced apart from each other with the light source 111 therebetween. Via this arrangement, the probability that the first light l1 will be directed toward the second optical sensor 113 or that the second light l2 will be directed toward the first optical sensor 112, may be reduced, thus increasing the resolution of the sensed fingerprint. However, exemplary embodiments are not limited to this arrangement. When the first optical sensor 112 and the second optical sensor 113 are spaced apart from each other by a certain distance that is equal to or greater than a reference distance, the resolution may be increased.

The light-emitter 120 may be a region designated for displaying an image. The light-emitter 120 may include OLED pixels 121-R, 121-G, and 121-B configured to emit visible red (R), green (G), and blue (B) light toward a front surface of the 3D fingerprint sensing device. For example, the first OLED pixel 121-G may irradiate green light, the second OLED pixel 121-R may irradiate red light, and the third OLED pixel 121-B may irradiate blue light. Each of the OLED pixels 121-R, 121-G, and 121-B may include an organic light-emission layer and a driving voltage line, a driving voltage line configured to function as an anode, and a portion of a common voltage line configured to function as a cathode. Detailed aspects of the OLED pixels 121-R, 121-G, and 121-B are known technology, and thus, they will not be described in detail.

Details of the arrangements of the OLED pixels 121-R, 121-G, and 121-B may vary depending on the display of which they form a part. Examples of detailed arrangements of the OLED pixels 121-R, 121-G, and 121-B will be described with reference to FIGS. 4 through 6.

The light-mixing blocker 130 may block the first light l1 from being incident on the second optical sensor 113 and the second light l2 from being incident on the first optical sensor 112. The light-mixing blocker 130 may be arranged above or below the light-emitter 120. For example, the light-mixing blocker 130 may include a parallax barrier configured to block the invisible light irradiated by the light source 111 and to allow visible light, irradiated by the OLED pixels 121-R, 121-G, and 121-B to penetrate therethrough. The light-mixing blocker 130 may allow a portion of the first light l1, which is directed toward the first optical sensor 112, to be transmitted through an opening of the light-mixing blocker 130, and may block a portion of the first light l1, which is directed toward the second optical sensor 113. The light-mixing blocker 130 may allow a portion of the second light l2, which is directed toward the second optical sensor 113, to be transmitted through an opening of the light-mixing blocker 130, and may block a portion of the second light l2, which is directed toward the first optical sensor 112. A parallax barrier is a device typically used in a 3D image apparatus configured to generate a 3D image by irradiating different images to a right eye and a left eye. The light-mixing blocker 130, according to an exemplary embodiment, may operate in a substantially inverse manner.

The passivation layer 140 may be configured to protect the 3D fingerprint sensing device 100. For example, the passivation layer 140 may be arranged on the light-emitter 120 and the 3D fingerprint sensing unit 110 in order to protect the structures below the passivation layer 140 and may form a display surface and a biometrics recognition surface. The passivation layer 140 may include, for example, cover glass or cover plastic. The passivation layer 140 may include a transparent material, which may allow both the invisible light of the light source 111 and the visible light of the OLED pixels 121-R, 121-G, and 121-B to be incident on the passivation layer 140, but is not limited thereto.

Figure 2:
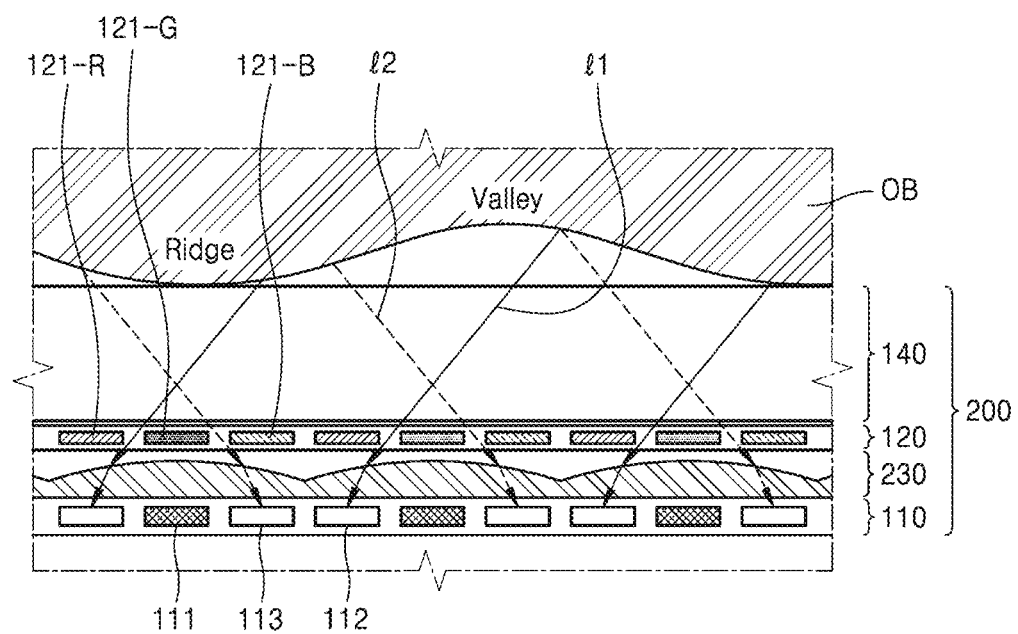
FIG. 2 is a cross-sectional view schematically showing a structure of a 3D fingerprint sensing device according to another exemplary embodiment.

FIG. 2 is a cross-sectional view schematically showing a structure of a 3D fingerprint sensing device 200 according to another exemplary embodiment. Referring to FIG. 2, the 3D fingerprint sensing device 200 may include the 3D fingerprint sensing unit 110, the light-emitter 120, a light-mixing blocker 230, and the passivation layer 140. The components other than the light-mixing blocker 230 are the same as described above with respect to FIG. 1, and thus, they will not be described again.

According to the present exemplary embodiment, the light-mixing blocker 230 may be arranged below the light-emitter 120. For example, the light-mixing blocker 230 may include a lenticular lens array. The light-mixing blocker 230 may have focus and refract light but not selectively block the light, and thus, the first light l1 may be received by the first optical sensor 112 and the second light l2 may be received by the second optical sensor 113.

In the 3D fingerprint sensing devices 100 and 200 according to the exemplary embodiments of FIGS. 1 and 2, the light-emitter 120 is not covered or shielded by the 3D fingerprint sensing unit 110, and thus, an aperture ratio of 100% may be maintained. Also, since the 3D fingerprint sensing devices 100 and 200 according to the exemplary embodiments of FIGS. 1 and 2 include the 3D fingerprint sensing unit 110 and the light-mixing blockers 130 and 230, the 3D fingerprint sensing devices 100 and 200 may obtain a 3D image of a surface of the object OB, thus improving the security of the unit.

Figure 3:
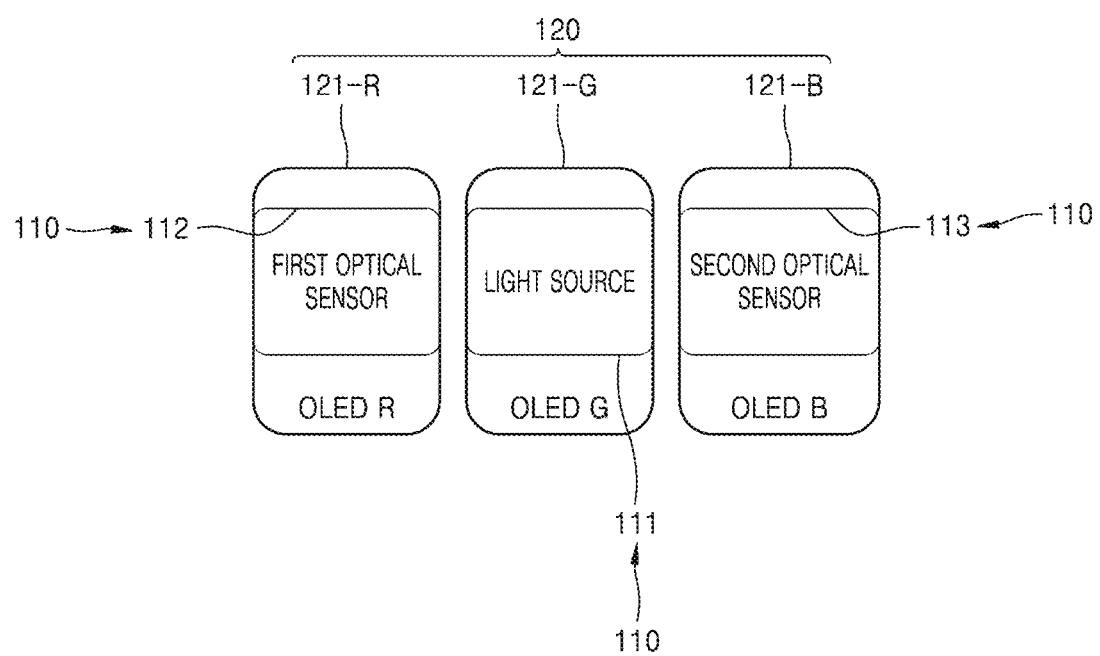
FIG. 3 is a conceptual view schematically showing a positional relationship between a light-emitter and a 3D fingerprint sensing unit, according to an exemplary embodiment.
Figure 4:
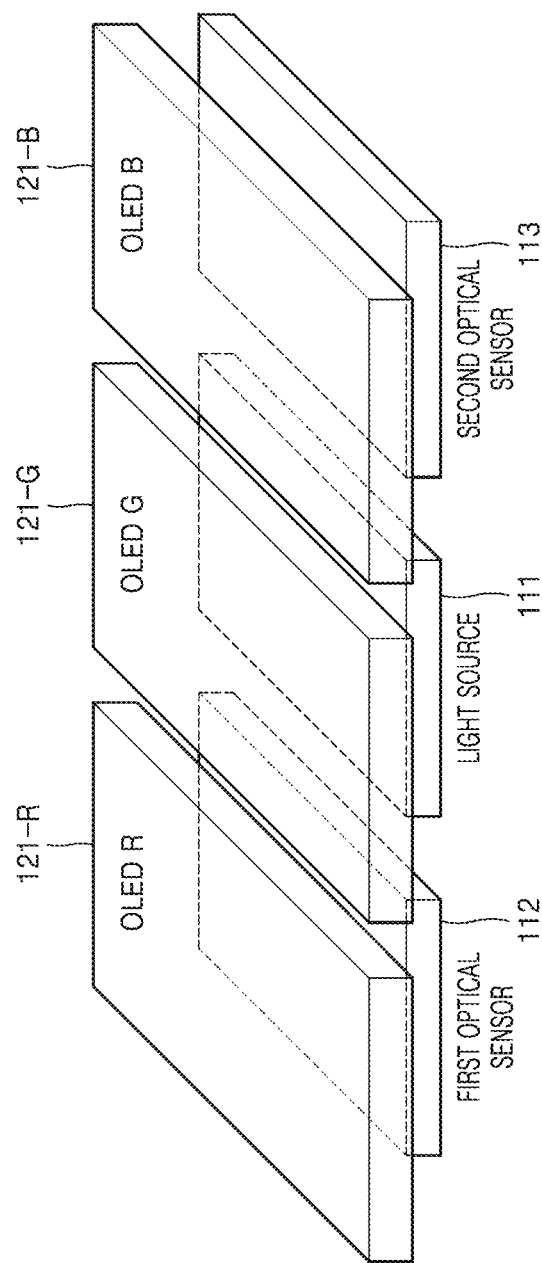
FIG. 4 is a perspective view schematically showing the positional relationship between the light-emitter and the 3D fingerprint sensing unit of FIG. 3.

FIG. 3 is a conceptual view schematically showing a positional relationship between the light-emitter 120 and the 3D fingerprint sensing unit 110, according to an exemplary embodiment. FIG. 4 is a perspective view schematically showing the positional relationship between the light-emitter 120 and the 3D fingerprint sensing unit 110 of FIG. 3.

Referring to FIGS. 3 and 4, the components of the light-emitter 120 may be arranged to overlap with the components of the 3D fingerprint sensing unit 110.

The light source 111, the first optical sensor 112, and the second optical sensor 113 may be arranged below the OLED pixels 121-R, 121-G, and 121-B, thus respectively overlapping with the OLED pixels 121-R, 121-G, and 121-B, respectively. For example, the light source 111 may be arranged below the first OLED pixel 121-G displaying a first color, the first optical sensor 112 may be arranged below the second OLED pixel 121-R displaying a second color, and the second optical sensor 113 may be arranged below the third OLED pixel 121-B displaying a third color. When the OLED pixels 121-R, 121-G, and 121-B are surrounded by a black matrix, this arrangement may prevent the degradation of an the efficiency of fingerprint sensing of the light source 111, the first optical sensor 112, and the second optical sensor 113.

The light source 111, the first optical sensor 112, and the second optical sensor 113 may contact one another or may be spaced apart from one another by a certain distance. The first OLED pixel 121-G, the second OLED pixel 121-R, and the third OLED pixel 121-B may contact one another or may be spaced apart from one another by a certain distance. The light source 111, the first optical sensor 112, and the second optical sensor 113 may all be included in a single 3D fingerprint sensing pixel. The first OLED pixel 121-G, the second OLED pixel 121-R, and the third OLED pixel 121-B may all be included in a single light-emitting pixel.

Figure 5:
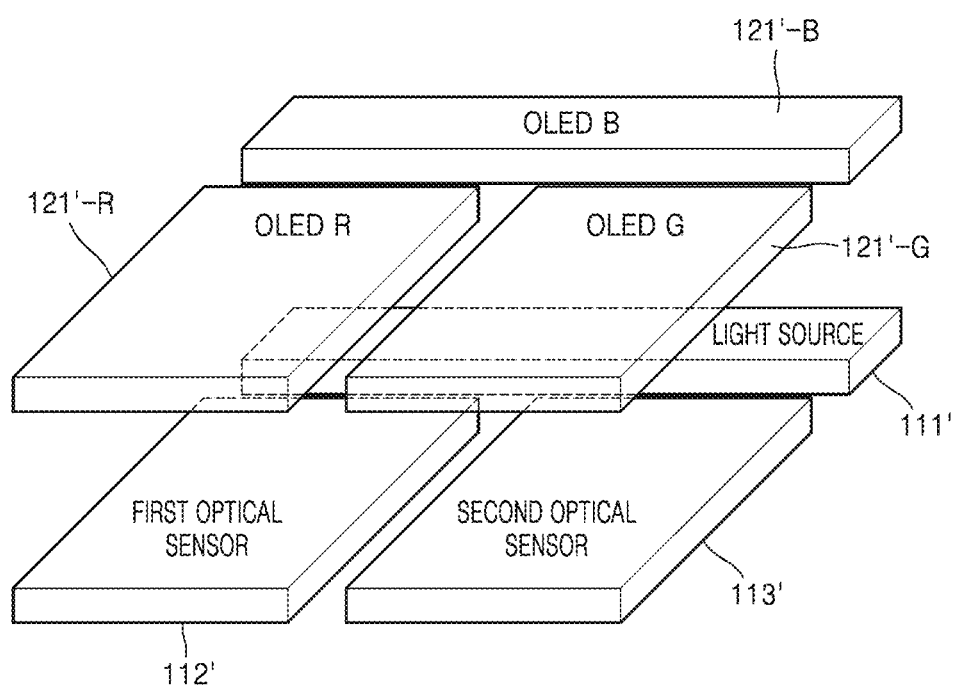
FIG. 5 is a perspective view schematically showing a positional relationship between a light-emitter and a 3D fingerprint sensing unit, according to another exemplary embodiment.

FIG. 5 is a perspective view schematically showing a positional relationship between a light-emitter and a 3D fingerprint sensing unit, according to another exemplary embodiment.

Referring to FIG. 5, OLED pixels 121'-R, 121'-G, and 121'-B may have different shapes and sizes from one another. For example, a ratio of a long side to a short side of the OLED pixel 121'-B irradiating blue light may be greater than a ratio of a long side to a short side of the OLED pixel 121'-R irradiating red light and a ratio of a long side to a short side of the OLED pixel 121'-G irradiating green light. For example, the OLED pixels 121'-R, 121'-G, and 121'-B may be arranged such that the short sides of both of the OLED pixels 121'-R and 121'-G are adjacent to the long side of the OLED pixel 121'-B.

A light source 111', a first optical sensor 112', and a second optical sensor 113' may be arranged below the OLED pixels 121'-R, 121'-G, and 121'-B to overlap the OLED pixels 121'-R, 121'-G, and 121'-B, respectively. For example, the light source 111' may be arranged below the OLED pixel 121'-B irradiating the blue light. A ratio of a long side to a short side of the light source 111' may be greater than a ratio of a long side to a short side of the first optical sensor 112' and a ratio of a long side to a short side of the second optical sensor 113'.

Figure 6:
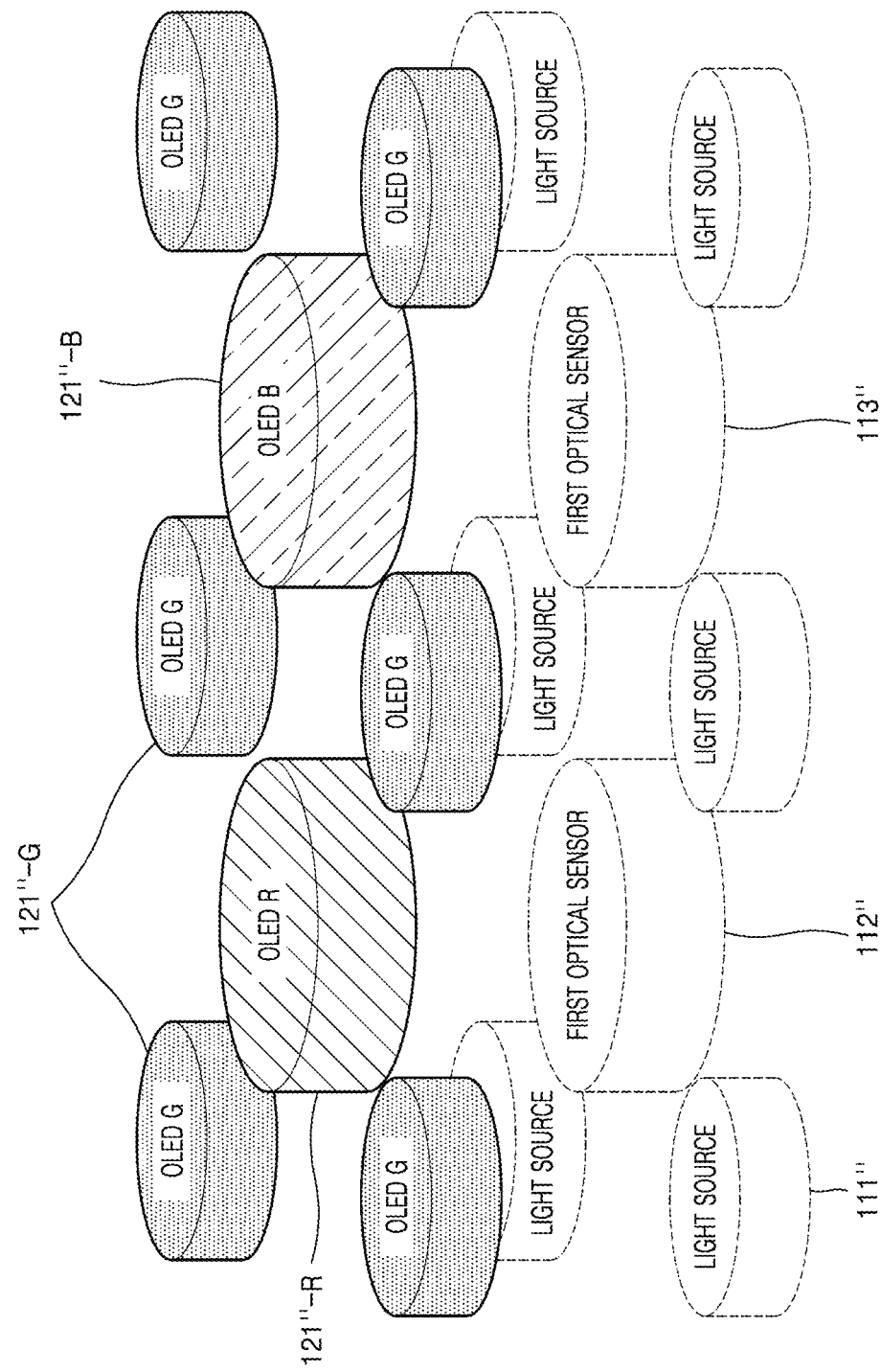
FIG. 6 is a perspective view schematically showing a positional relationship between a light-emitter and a 3D fingerprint sensing unit, according to another exemplary embodiment.

FIG. 6 is a perspective view schematically showing a positional relationship between a light-emitter and a 3D fingerprint sensing unit, according to another exemplary embodiment. Referring to FIG. 6, OLED pixels 121"-R, 121"-G, and 121"-B may have different shapes and sizes from one another.

The OLED pixel 121"-R irradiating red light and the OLED pixel 121"-B irradiating blue light may have greater sizes than the OLED pixel 121"-G irradiating green light. For example, a number of the OLED pixels 121"-G may be arranged in a square grid, and OLED pixels 121"-R irradiating the red light and OLED pixels 121"-B irradiating the blue light may be arranged at centers of the squares formed by the grid.

A light source 111", a first optical sensor 112", and a second optical sensor 113" may be arranged below the OLED pixels 121"-R, 121"-G, and 121"-B to overlap the OLED pixels 121"-R, 121"-G, and 121"-B, respectively. For example, the light source 111" may be arranged below the OLED pixel 121"-G irradiating the green light. A number of the light sources 111" may be arranged in a square grid like the OLED pixel 121"-G. The first optical sensor 112" may be arranged below the OLED pixel 121"-R irradiating the red light. The second optical sensor 113" may be arranged below the OLED pixel 121"-B irradiating the blue light. The first optical sensor 112" and the second optical sensor 113" may be arranged at centers of the squares formed by the grid arrangement.

Figure 7:
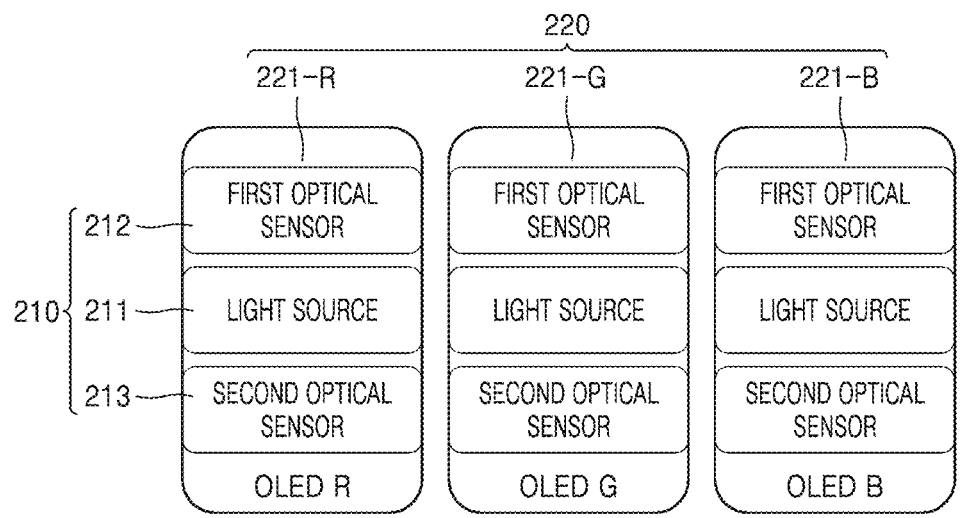
FIG. 7 is a conceptual view schematically showing a positional relationship between a light-emitter and a 3D fingerprint sensing unit, according to another exemplary embodiment.
Figure 8:
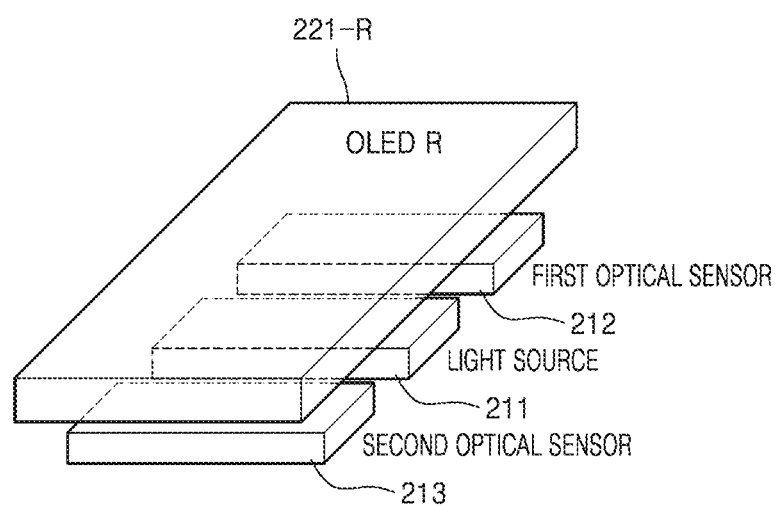
FIG. 8 is a perspective view schematically showing the positional relationship between the light-emitter and the 3D fingerprint sensing unit of FIG. 7.

FIG. 7 is a conceptual view schematically showing a positional relationship between a light-emitter 220 and a 3D fingerprint sensing unit 210, according to another exemplary embodiment. FIG. 8 is a perspective view schematically showing a positional relationship between the light-emitter 220 and the 3D fingerprint sensing unit 210 of FIG. 7.

Referring to FIGS. 7 and 8, a light source 211, a first optical sensor 212, and a second optical sensor 213 may be arranged below a single OLED pixel 221-R, 221-G, or 221-B. As shown in a plan view, the light source 211, the first optical sensor 212, and the second optical sensor 213 may overlap a single OLED pixel 221-R, 221-G, or 221-B. Alternately, a light source 211, a first optical sensor 212, and a second optical sensor may be arranged below each OLED pixel. AS shown in a plan view, a light source 211, a first optical sensor 212, and a second optical sensor 213 may overlap each of an OLED pixel 221-R, an OLED pixel 221-G, and an OLED pixel 221-B, as shown in FIG. 7.

Figure 9:
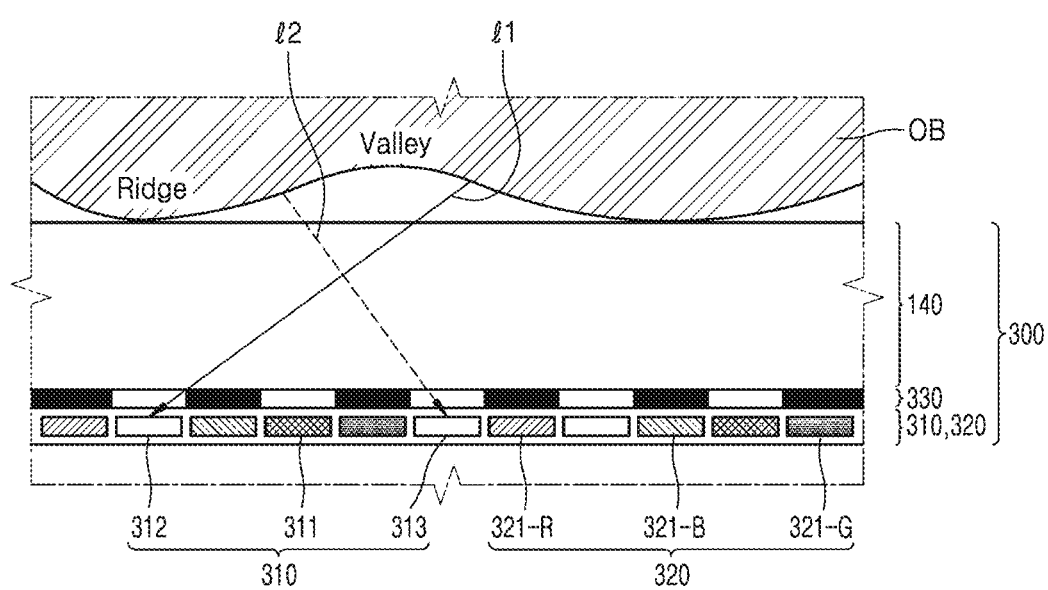
FIG. 9 is a cross-sectional view schematically showing a structure of a 3D fingerprint sensing device according to another exemplary embodiment.
Figure 10:
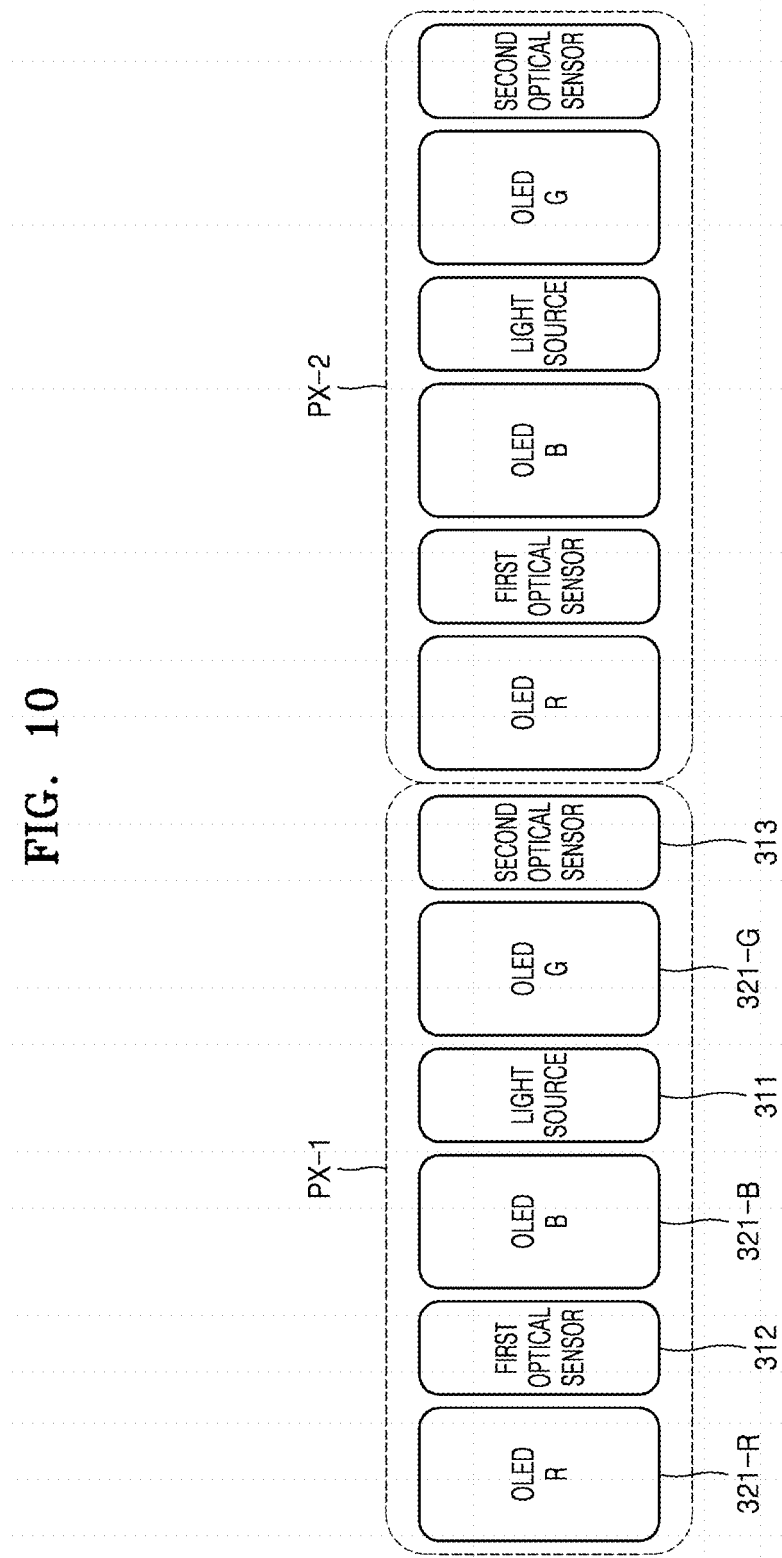
FIG. 10 is a plan view schematically showing a positional relationship between a light-emitter and a 3D fingerprint sensing unit of FIG. 9.

FIG. 9 is a cross-sectional view schematically showing a structure of a 3D fingerprint sensing device 300 according to another exemplary embodiment. FIG. 10 is a plan view schematically showing a positional relationship between a light-emitter 320 and a 3D fingerprint sensing unit 310 of FIG. 9.

Referring to FIGS. 9 and 10, the 3D fingerprint sensing device 300 may include the 3D fingerprint sensing unit 310 and the light-emitter 320 arranged in the same layer.

Detailed structures of the 3D fingerprint sensing unit 310 and the light-emitter 320 are substantially the same as the structures described with reference to the exemplary embodiments described above. However, the arrangement of the 3D fingerprint sensing unit 310 and the light-emitter 320 is different from that of the exemplary embodiments described above, and thus, descriptions will be given based on the difference.

In the 3D fingerprint sensing device 300 according to the present exemplary embodiment, the light-emitter 320 and the 3D fingerprint sensing unit 310 may be arranged in the same layer, and thus, a thickness of the 3D fingerprint sensing device 300 may be decreased. The 3D fingerprint sensing unit 310 may include a light source 311, a first optical sensor 312, and a second optical sensor 313. The light-emitter 320 may include OLED pixels 321-R, 321-B, and 321-G. The light source 311, the first optical sensor 312, and the second optical sensor 313 may be arranged among the OLED pixels 321-R, 321-B, and 321-G. In this arrangement, the first light l1 may be prevented from being incident on the second optical sensor 313. Likewise, the second light l2 may be prevented from being incident on the first optical sensor 312.

The light-mixing blocker 330 may include a parallax barrier, as discussed with respect to FIG. 1. The light-mixing blocker 330 may be arranged on the fingerprint sensing unit 310 and the light-emitter 320 and may prevent the first light l1 from being incident on the second optical sensor 313 and the second light l2 from being incident on the first optical sensor 312.

Referring to FIG. 10, each single pixel unit PX-1 and PX-2 includes the OLED pixels 321-R, 321-B, and 321-G, and the light source 311, the first optical sensor 312, and the second optical sensor 313, arranged among the OLED pixels 321-R, 321-B, and 321-G.

Figure 11:
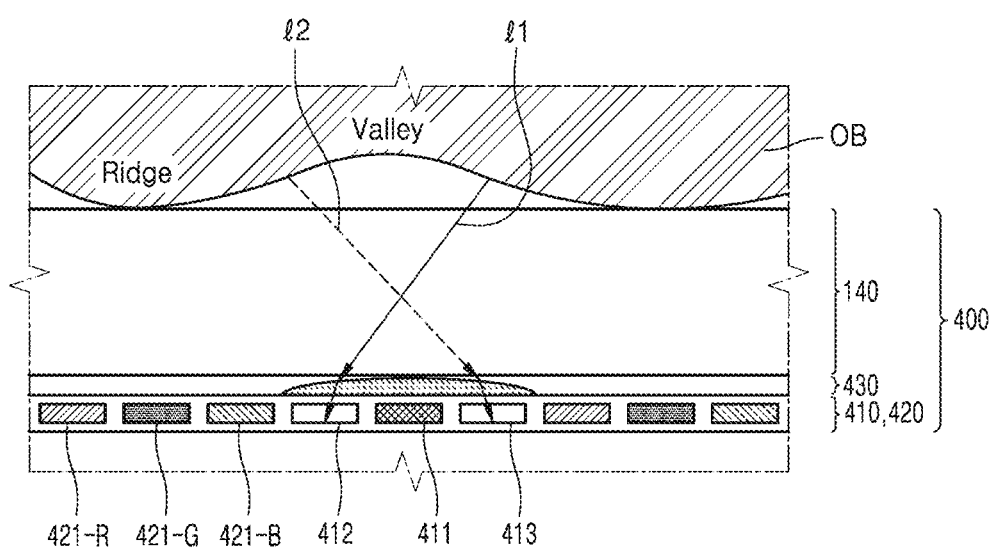
FIG. 11 is a cross-sectional view schematically showing a structure of a 3D fingerprint sensing device according to another exemplary embodiment.
Figure 12:
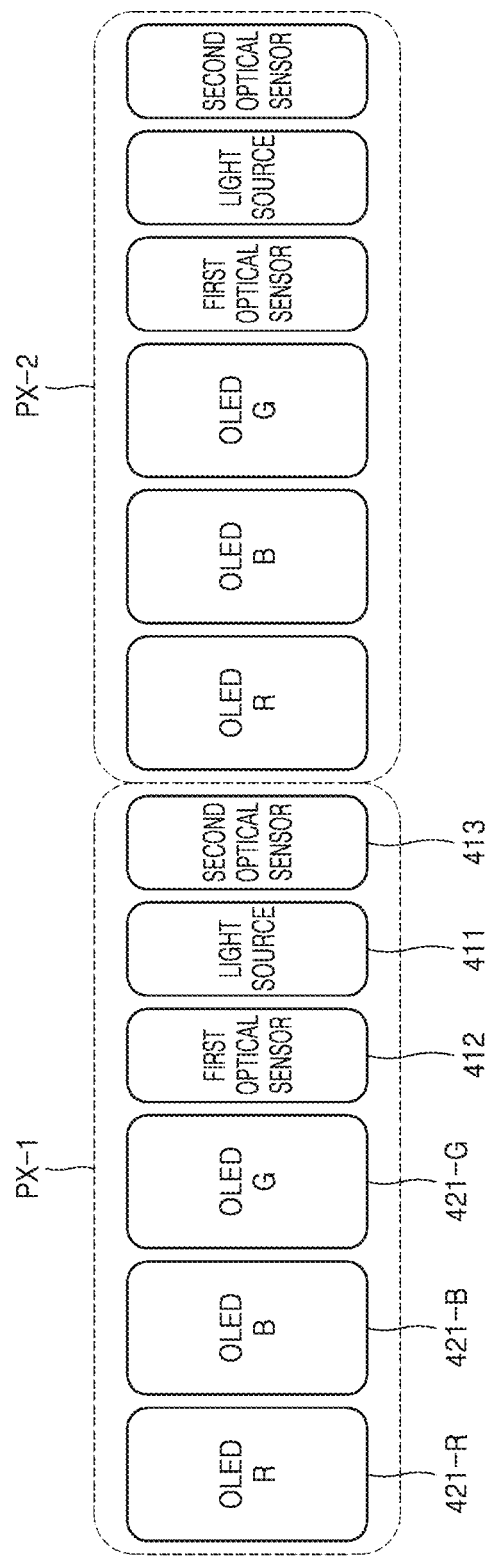
FIG. 12 is a plan view schematically showing a positional relationship between a light-emitter and a 3D fingerprint sensing unit of FIG. 11.

FIG. 11 is a cross-sectional view schematically showing a structure of a 3D fingerprint sensing device 400 according to another exemplary embodiment. FIG. 12 is a plan view schematically showing a positional relationship between a light-emitter 420 and a 3D fingerprint sensing unit 410 of FIG. 11. The 3D fingerprint sensing device 400 may include the 3D fingerprint sensing unit 410, the light-emitter 420, a light-mixing blocker 430, and the passivation layer 140. The light-mixing blocker 430 according to the present exemplary embodiment may include a lenticular lens or a lenticular lens array. The light-mixing blocker 430 may prevent the first light l1 from being incident on the second optical sensor 413 and may prevent the second light l2 from being incident on the first optical sensor 412.

Figure 13:
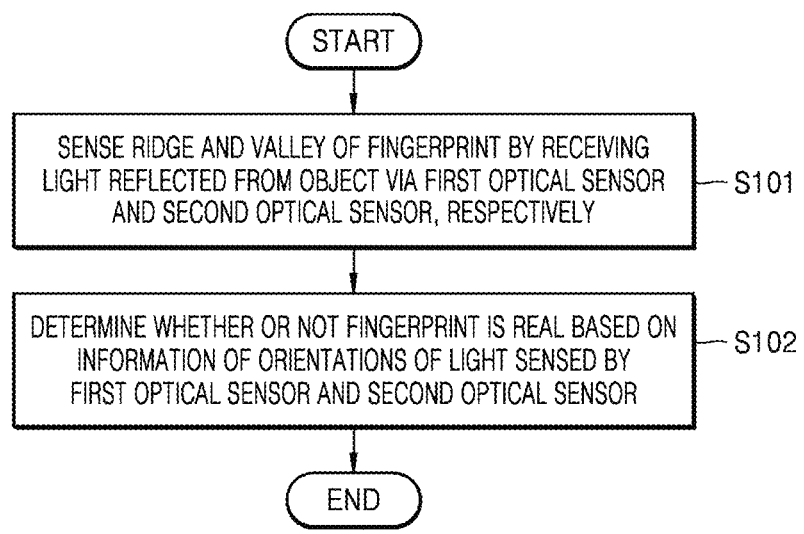
FIG. 13 is a flowchart of a method of sensing a fingerprint, according to an exemplary embodiment.

FIG. 13 is a flowchart of a method of sensing a fingerprint, according to an exemplary embodiment. Referring to FIG. 13, the method of sensing the fingerprint may include sensing a ridge and a valley of the fingerprint (S101) and determining whether a fingerprint is real or fake (S102).

The sensing of the ridge and the valley of the fingerprint (S101) may include sensing the ridge and the valley of the fingerprint based on intensities of light, by receiving the light reflected from the object OB via a first optical sensor and a second optical sensor. The sensing of the ridge and the valley may be performed by an external controller (not shown), but is not limited thereto.

Figure 14:
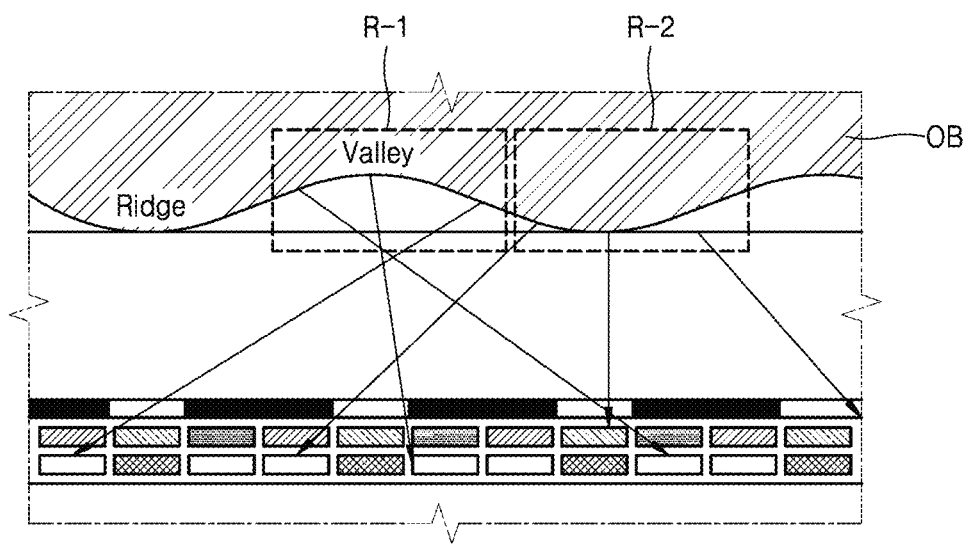
FIG. 14 is a view showing an example of sensing a real fingerprint.
Figure 15:
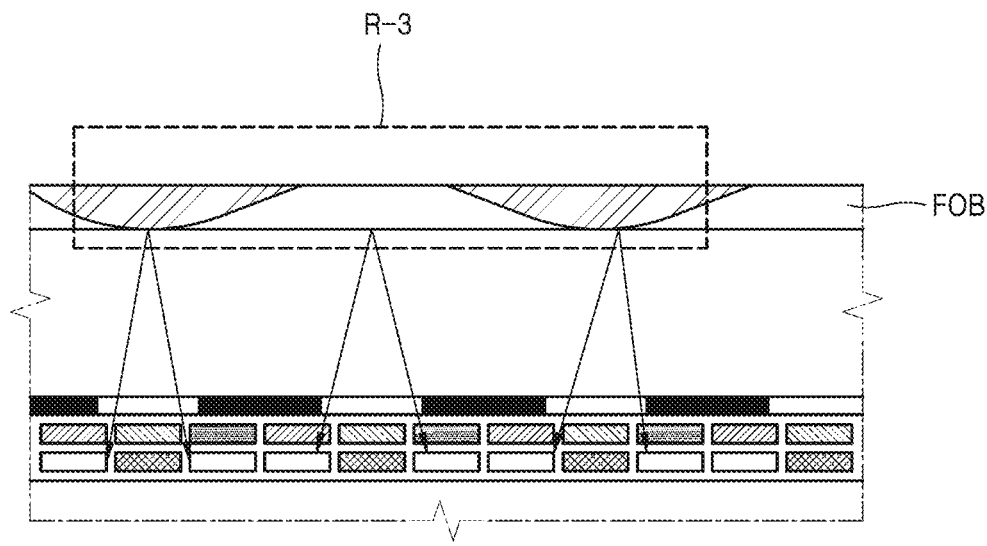
FIG. 15 is a view showing an example of sensing a false fingerprint.

The determining whether the fingerprint is real or fake (S102) will be described with reference to FIGS. 14 and 15. FIG. 14 is a view showing an example of sensing a real fingerprint of the object OB, and FIG. 15 is a view showing an example of sensing a fake fingerprint of a false object FOB.

Referring to FIG. 14, in the case of the real object fingerprint, the real fingerprint has a three-dimensionally curved shape, and thus, light reflected from a valley region R-1 and from a ridge region R-2 are reflected in different directions. For example, the light reflected from the valley region R-1 converges, and the light reflected from the ridge region R-2 diverges. In contrast, referring to FIG. 15, in the case of a fake fingerprint of a false object FOB (i.e., a picture of a fingerprint or a paper on which a fingerprint is printed), the surface of the false object FOB is flat, and thus, light is uniformly reflected from the entire region R-3 and is received via optical sensors in the same direction. Thus, the determining of whether the fingerprint is real or fake (S102) may be performed based on the different distributions of angles at which the light is reflected from a real fingerprint as compared to a fake fingerprint, by using the 3D fingerprint sensing units 110, 210, 310, and 410 according to the exemplary embodiments described above.

Figure 16:
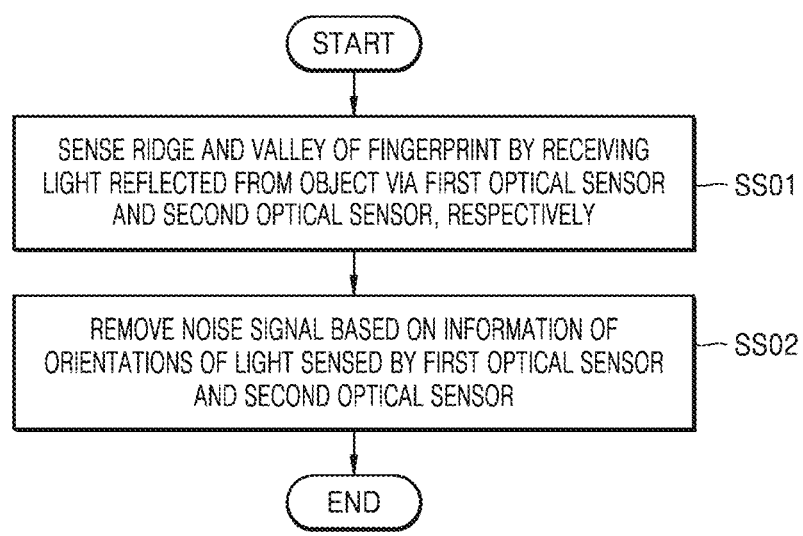
FIG. 16 is a flowchart of a method of sensing a fingerprint, according to another exemplary embodiment.
Figure 17A:
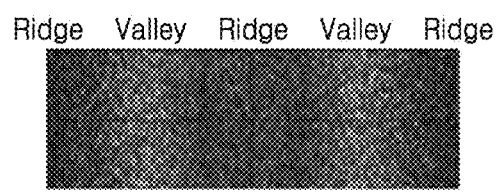
FIG. 17A and FIG. 17B are views showing examples of sensing a fingerprint, whereby noise is removed.
Figure 17B:
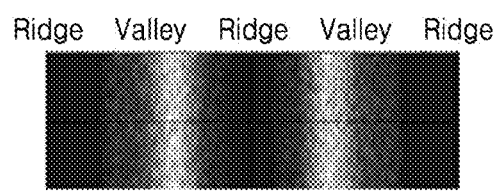

FIG. 16 is a flowchart of a method of sensing a fingerprint, according to another exemplary embodiment. FIGS. 17A and 17B are views showing examples of sensing a fingerprint, whereby noise is removed.

The method of sensing the fingerprint according to the present exemplary embodiment may include the sensing of the ridge and the valley of the fingerprint (S101) and removing a noise signal (S202).

The removing of the noise signal (S202) may include removing the noise signal by subtracting an intensity of a light signal having no orientation from information of light incident on the optical sensors. For example, when an object (i.e., a fingerprint) does not sufficiently contact a 3D fingerprint sensing unit, in addition to the invisible light irradiated from the 3D fingerprint sensing unit, external invisible light, within a corresponding wavelength range, may also be incident on the 3D fingerprint sensing unit. In this case, the external invisible light is irradiated onto the whole 3D fingerprint sensing unit without a particular orientation, and thus, noise may be generally generated in a sensed image.

FIG. 17A is a simulated noisy image of a fingerprint when a tip of a finger is dry, and thus, does not sufficiently contact the 3D fingerprint sensing device. FIG. 17B is a simulated image, in which an intensity of non-directional light is subtracted from the intensity sensed by the optical sensors. In the image of FIG. 17B, the ridge and the valley are clearly distinguishable from each other.

Figure 18:
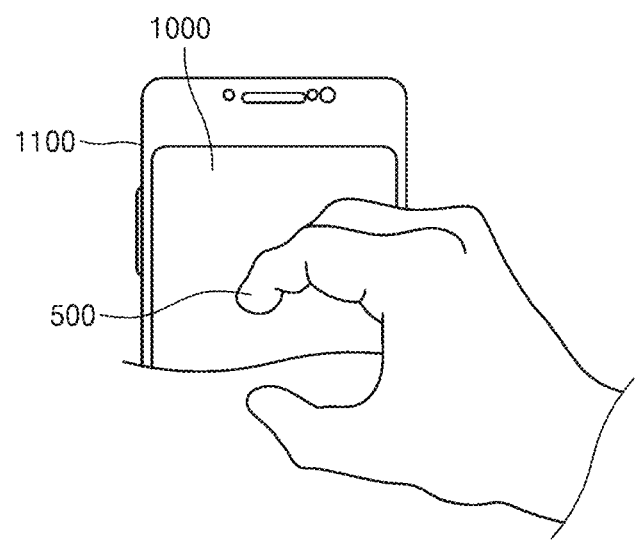
FIG. 18 is a view showing an electronic apparatus according to an exemplary embodiment.

FIG. 18 is a view schematically showing an electronic apparatus 1100 including a 3D fingerprint sensing device 1000 according to one or more of the exemplary embodiments described above. The electronic apparatus 1100 may directly and three-dimensionally sense a fingerprint on a surface of an object 500, and may have a display function via a light-emitter. The electronic apparatus 1100 may distinguish a picture of a fingerprint, having no 3D curvedness, from a real fingerprint, as described above.

FIG. 18 shows a smartphone, as an example of the electronic apparatus 1100. However, in addition to the smartphone, the electronic apparatus 1100 may include any of a multimedia player, a tablet personal computer (PC), a television (TV), etc., having a screen, in which a light-emitter and a 3D fingerprint sensing unit may be implemented.

According to a 3D fingerprint sensing device and electronic apparatus including the same, according to an exemplary embodiment, a three-dimensional curve of a fingerprint may be measured to identify a ridge and a valley, and thus, the security may be enhanced. The 3D fingerprint sensing device and the electronic apparatus including the same may include a light-mixing blocker configured to allow a 3D image to be formed by distinguishing light reflected from an object in different directions, so as to be received by different optical sensors.

According to a 3D fingerprint sensing device and electronic apparatus including the same, according to an exemplary embodiment, the 3D fingerprint sensing unit may be formed below a light-emitter, and thus, the opening of the light-emitter may be 100% maintained in order to secure display characteristics.

According to a 3D fingerprint sensing device and electronic apparatus including the same, according to an exemplary embodiment, light of an NIR wavelength range or light of an IR wavelength range may be used so that interference between the light of the NIR wavelength range or the light of the IR wavelength range, and visible light of the light-emitter may be prevented.

According to a 3D fingerprint sensing device and the electronic apparatus including the same, according to an exemplary embodiment, a 3D fingerprint sensing unit may be formed on a same layer as the light-emitter, in order to reduce a thickness of the 3D fingerprint sensing device.

According to a 3D fingerprint sensing device and the electronic apparatus including the same, according to an exemplary embodiment, an organic material may be included in the 3D fingerprint sensing device and the electronic apparatus including the same, and thus, the 3D fingerprint sensing device and the electronic apparatus including the same may be bendable and flexible. Accordingly, a flexible display apparatus may be manufactured, and thus, portability and applicability of the display apparatus may be increased.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A three-dimensional (3D) fingerprint sensing device comprising:
   a light-emitter comprising a plurality of organic light-emitting diode (OLED) pixels, each configured to emit visible light;
   a 3D fingerprint sensing unit comprising a light source configured to emit invisible light, a plurality of first optical sensors configured to receive first light reflected from an object, and a plurality of second optical sensors configured to receive second light reflected from the object; and
   an optical layer configured to:
      transmit first portions of the first light to the plurality of first optical sensors,
      prevent second portions of the first light from being incident on the plurality of second optical sensors,
      transmit first portions of the second light to the plurality of second optical sensors, and
      prevent second portions of the second light from being incident on the plurality of second optical sensors,
   wherein the plurality of first optical sensors and the plurality of second optical sensors are alternately arranged in a first direction,
   wherein a traveling direction of the first light includes the first direction as a component,
   wherein a traveling direction of the second light includes a second direction opposite to the first direction as a component, and
   wherein the light source is further configured to emit the invisible light through the optical layer to the object including the fingerprint.

2. The 3D fingerprint sensing device of claim 1, wherein the 3D fingerprint sensing unit is arranged below the light-emitter, such that light emitted from the light-emitter is not transmitted through the 3D fingerprint sensing unit prior to being emitted from the 3D fingerprint sensing device.

3. The 3D fingerprint sensing device of claim 2, wherein the light source, the plurality of first optical sensors, and the plurality of second optical sensors are arranged below and overlapping with a layer comprising the plurality of OLED pixels.

4. The 3D fingerprint sensing device of claim 3, wherein:
   the plurality of OLED pixels comprise a first OLED pixel configured to emit a first color, a second OLED pixel configured to emit a second color, different from the first color, and a third OLED pixel configured to emit a third color, different from the first color and the second color; and
   the light source is arranged below the first OLED pixel, one of the plurality of first optical sensors is arranged below the second OLED pixel, and one of the plurality of second optical sensors is arranged below the third OLED pixel.

5. The 3D fingerprint sensing device of claim 2, wherein all of the light source, one of the plurality of first optical sensors, and one of the plurality of second optical sensors are arranged below a single OLED pixel of the plurality of OLED pixels.

6. The 3D fingerprint sensing device of claim 1, wherein the 3D fingerprint sensing unit and the light-emitter are arranged in a same layer.

7. The 3D fingerprint sensing device of claim 6, wherein one of the light source, the plurality of first optical sensors, and the plurality of second optical sensors is arranged between each adjacent pair of the plurality of OLED pixels.

8. The 3D fingerprint sensing device of claim 1, wherein one of the plurality of first optical sensors and one of the plurality of second optical sensors are spaced apart from each other, and the light source is disposed between the one of the plurality of first optical sensors and the one of the plurality of second optical sensors.

9. The 3D fingerprint sensing device of claim 1, wherein the light source is further configured to irradiate light in at least one of a near-infrared (NIR) wavelength range and an infrared (IR) wavelength range.

10. The 3D fingerprint sensing device of claim 1, wherein the optical layer is arranged on the light-emitter and comprises a parallax barrier including a plurality of openings, and
    wherein the parallax barrier is configured to block the invisible light irradiated by the light source such that the invisible light may only be transmitted through the plurality of openings, and to allow the visible light irradiated by the plurality of OLED pixels to be transmitted through the parallax barrier.

11. The 3D fingerprint sensing device of claim 1, further comprising:
    a passivation layer arranged on the optical layer.

12. An electronic apparatus comprising the three-dimensional (3D) fingerprint sensing device of claim 1.

13. A method of sensing a fingerprint using a three-dimensional (3D) fingerprint sensing device, the method comprising:
    emitting invisible light through an optical layer to an object including the fingerprint;
    receiving light reflected from the object through the optical layer;
    sensing intensities of incident light by a first optical sensor configured to receive first light reflected from the object and a second optical sensor configured to receive second light reflected from the object;
    determining a difference between the sensed intensities of the incident light;

determining whether the fingerprint is real based on the determined difference between the sensed intensities of the incident light; and determining that the fingerprint is fake based on there being no difference between the sensed intensities of the incident light, wherein the optical layer is configured to:

transmit first portions of the first light to the first optical sensor, prevent second portions of the first light from being incident on the second optical sensor, transmit first portions of the second light to the second optical sensor, and prevent second portions of the second light from being incident on the second optical sensor, wherein the first optical sensor and the second optical sensor are arranged in a first direction, wherein a traveling direction of the first light includes the first direction as a component, and wherein a traveling direction of the second light includes a second direction opposite to the first direction as a component.

14. The method of claim 13, wherein the determining whether the fingerprint is real comprises determining that the fingerprint is real by determining that light reflected from a valley converges and determining that light reflected from a ridge diverges.

15. The method of claim 14, wherein determining whether light converges or diverges is performed based on the sensed intensities of the incident light.

16. The method of claim 13, further comprising:

removing a noise signal based on sensed intensities of the incident light.

17. The method of claim 16, wherein the removing of the noise signal comprises:

when a non-directional light is sensed by the first optical sensor and the second optical sensor, removing a signal corresponding to the non-directional light.

18. A three-dimensional (3D) fingerprint sensing device comprising:

a light emitter configured to emit visible light;

an optical layer; and a 3D fingerprint sensing unit comprising a light source configured to emit invisible light, a plurality of first optical sensors configured to receive first light reflected from an object, and a plurality of second optical sensors configured to receive second light reflected from the object, wherein the optical layer is configured to:

transmit first portions of the first light to the plurality of first optical sensors, prevent second portions of the first light from being incident on the plurality of second optical sensors, transmit first portions of the second light to the plurality of second optical sensors, and prevent second portions of the second light from being incident on the plurality of second optical sensors, wherein the plurality of first optical sensors and the plurality of second optical sensors are alternately arranged in a first direction, wherein a traveling direction of the first light includes the first direction as a component, wherein a traveling direction of the second light includes a second direction opposite to the first direction as a component, and wherein the light source is further configured to emit the invisible light through the optical layer to the object including the fingerprint.

19. The 3D fingerprint sensing device of claim 18, wherein the 3D fingerprint sensing unit and the light emitter are arranged in a single layer, such that the 3D fingerprint sensing unit and the light emitter do not overlap.

20. The 3D fingerprint sensing device of claim 18, wherein the 3D fingerprint sensing unit is arranged in a first layer and the light emitter is arranged in a second layer, overlapping the first layer.

* * * * *